United States Patent [19]

Zebley et al.

[11] Patent Number: 4,690,302

[45] Date of Patent: Sep. 1, 1987

[54] PACKAGE AND APPARATUS FOR DISPENSING ELECTRICAL CONNECTORS

[75] Inventors: Raymond S. Zebley, York Haven, Pa.; James H. Nichols, Jr., Hockessin; Bernard M. Ciosek, Jr., Wilmington, both of Del.

[73] Assignee: E. I. Du Pont de Nemours and Company, Wilmington, Del.

[21] Appl. No.: 799,525

[22] Filed: Nov. 22, 1985

Related U.S. Application Data

[63] Continuation-in-part of Ser. No. 705,181, Feb. 25, 1985, abandoned.

[51] Int. Cl.⁴ .............................................. B65H 5/28
[52] U.S. Cl. ...................................... 221/11; 29/741; 193/31 A; 221/25; 221/81; 221/200; 221/298
[58] Field of Search ............... 221/191, 193, 194, 289, 221/290, 13, 14, 69, 76, 82-86, 92, 119, 121-122, 70-74, 200, 25, 298, 103-105, 81; 193/31 A, 31 R; 198/463.6; 206/328-332, 345-346; 29/741

[56] References Cited

U.S. PATENT DOCUMENTS

| | | | |
|---|---|---|---|
| 1,683,950 | 10/1926 | Borchert | 221/191 X |
| 2,583,700 | 1/1952 | Lyon | 221/289 |
| 3,127,177 | 3/1964 | Benoke | 221/194 |
| 3,253,735 | 5/1966 | Brown et al. | 221/298 X |
| 3,374,924 | 3/1968 | Fegley | 221/200 X |
| 3,727,757 | 4/1973 | Bossicat | 221/105 X |
| 4,169,541 | 10/1979 | Ragard et al. | 221/298 X |
| 4,212,102 | 7/1980 | Drinkard, Jr. | 29/741 |
| 4,288,023 | 9/1981 | Larrison | 221/122 X |
| 4,333,586 | 6/1982 | Stückler | 29/741 X |
| 4,354,615 | 10/1982 | Lindsey | 221/194 X |
| 4,401,234 | 8/1983 | Droira | 29/741 X |
| 4,500,246 | 2/1985 | Janisiewicz et al. | 221/11 X |
| 4,599,026 | 7/1986 | Feiber et al. | 414/126 |

FOREIGN PATENT DOCUMENTS

| | | | |
|---|---|---|---|
| 3003210 | 8/1981 | Fed. Rep. of Germany | 206/346 |
| 0127628 | 8/1982 | Japan | 221/119 |
| 2121764 | 1/1984 | United Kingdom | 206/328 |

*Primary Examiner*—Robert J. Spar
*Assistant Examiner*—P. McCoy Smith

[57] ABSTRACT

A package for connectors and an apparatus for dispensing them. The package comprises an elongated tape or pair of tapes and a plurality of an elongated connector containing tubes secured to and extending across the tape or tapes. The apparatus comprises a stand having upper and lower support members, a slide extending downwardly from the lower support member to a perch, and a stepping device for advancing successive tubes along the support members to the slide. Connectors are removed from the tubes descend the slide and are picked up from the perch by a robot and installed in a printed circuit board.

13 Claims, 24 Drawing Figures

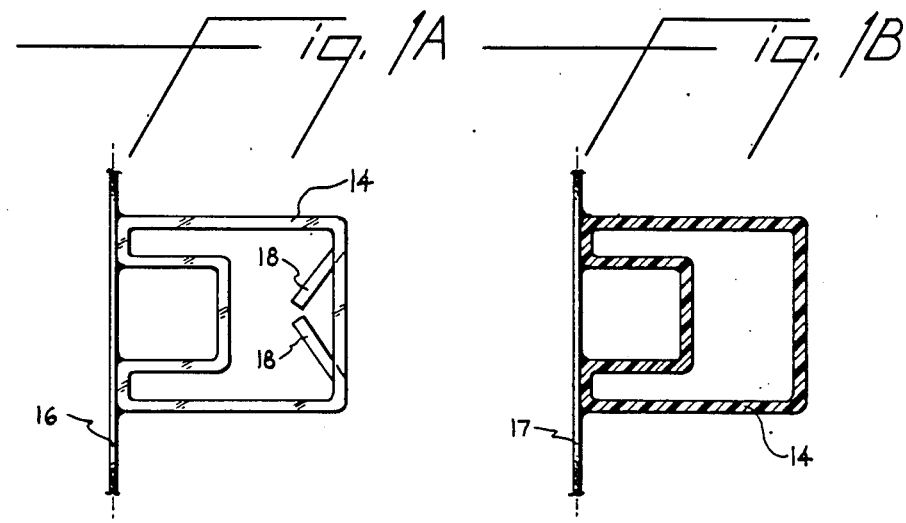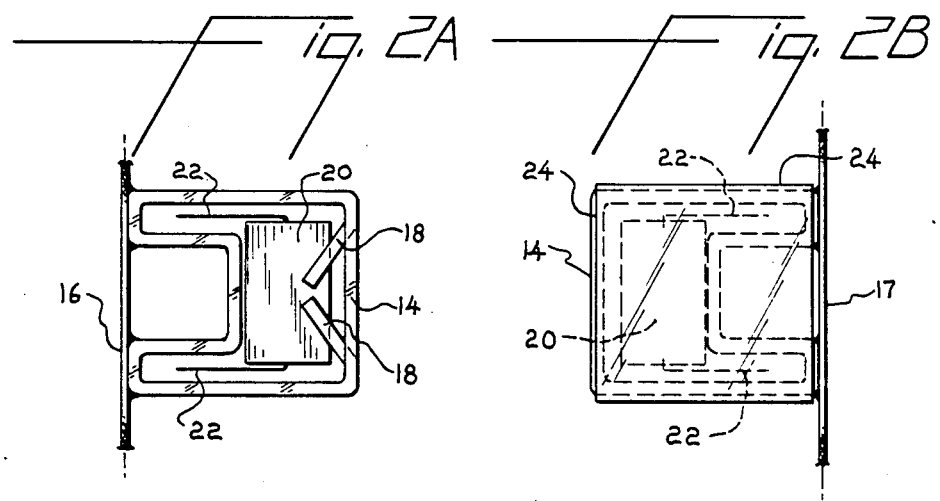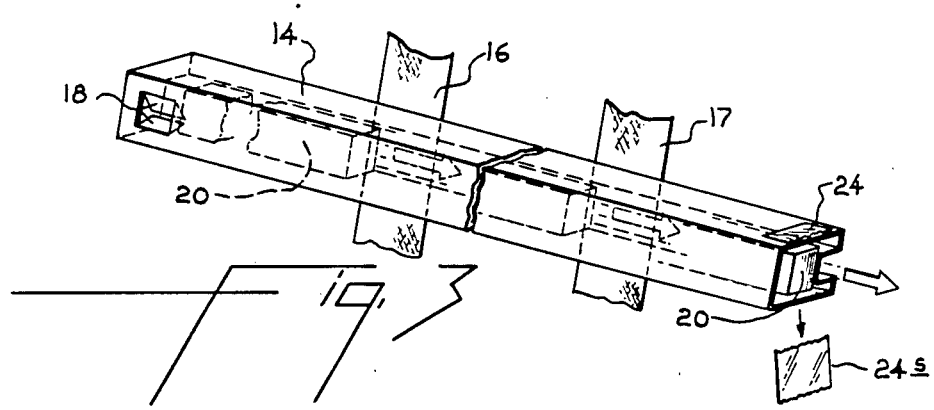

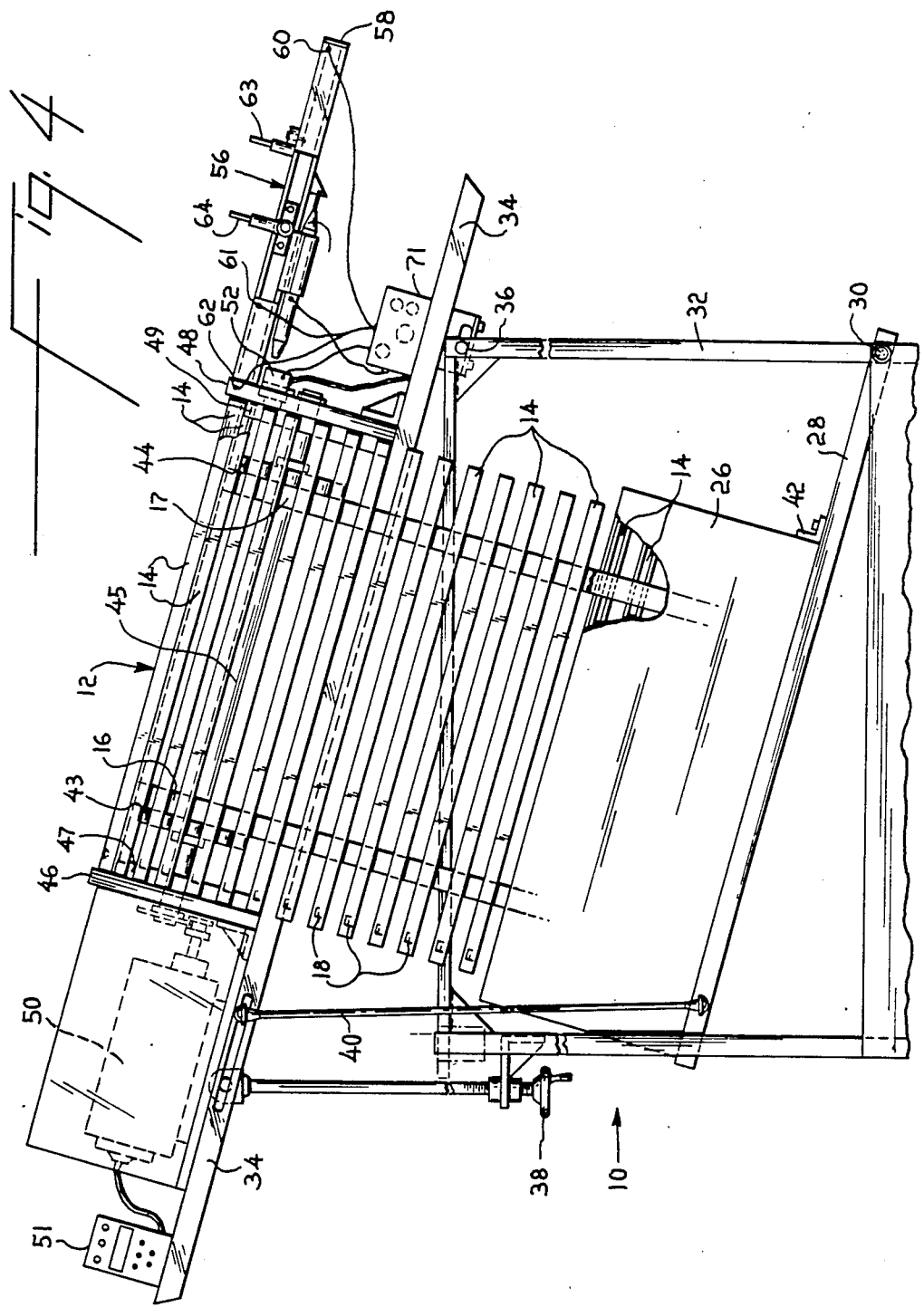

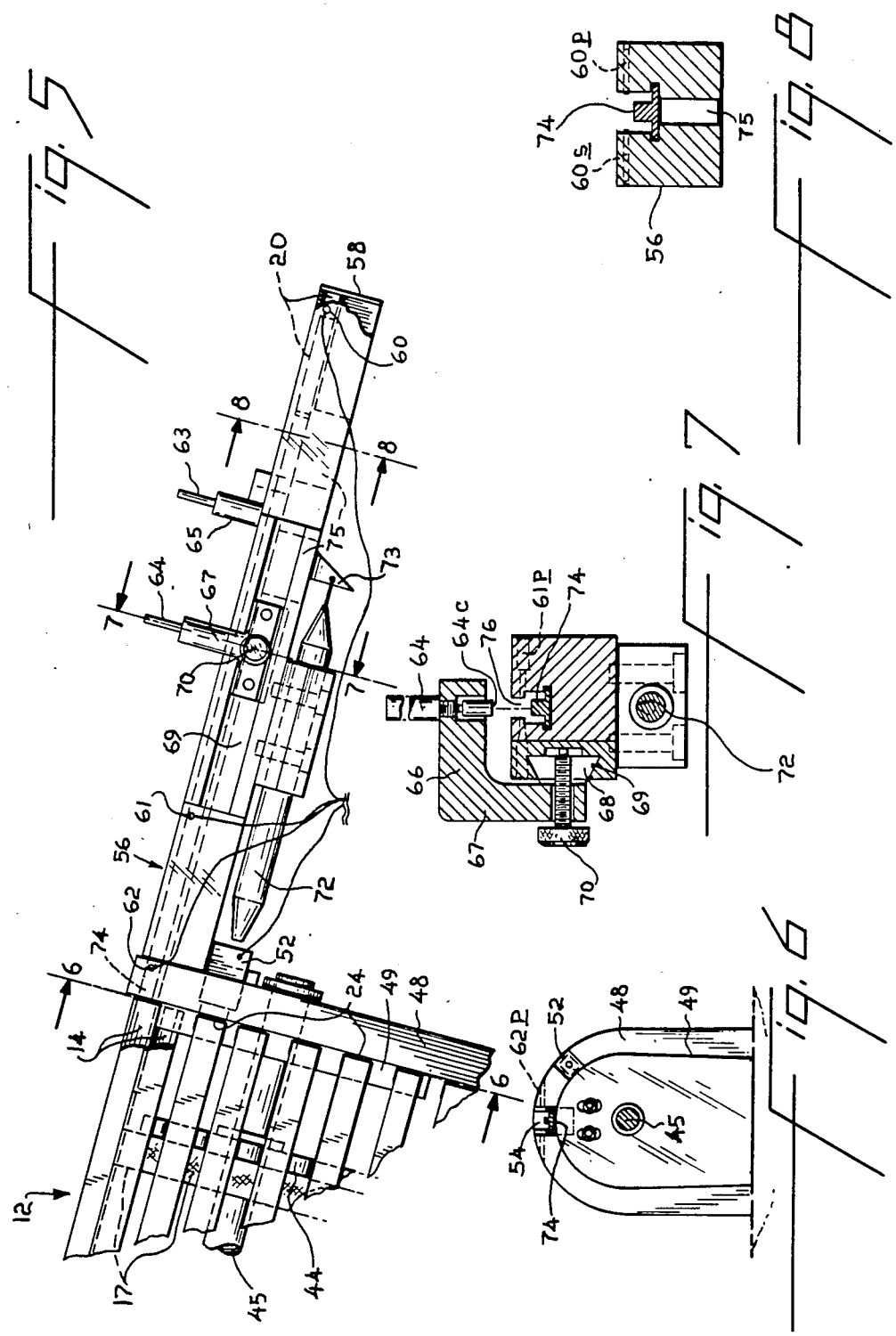

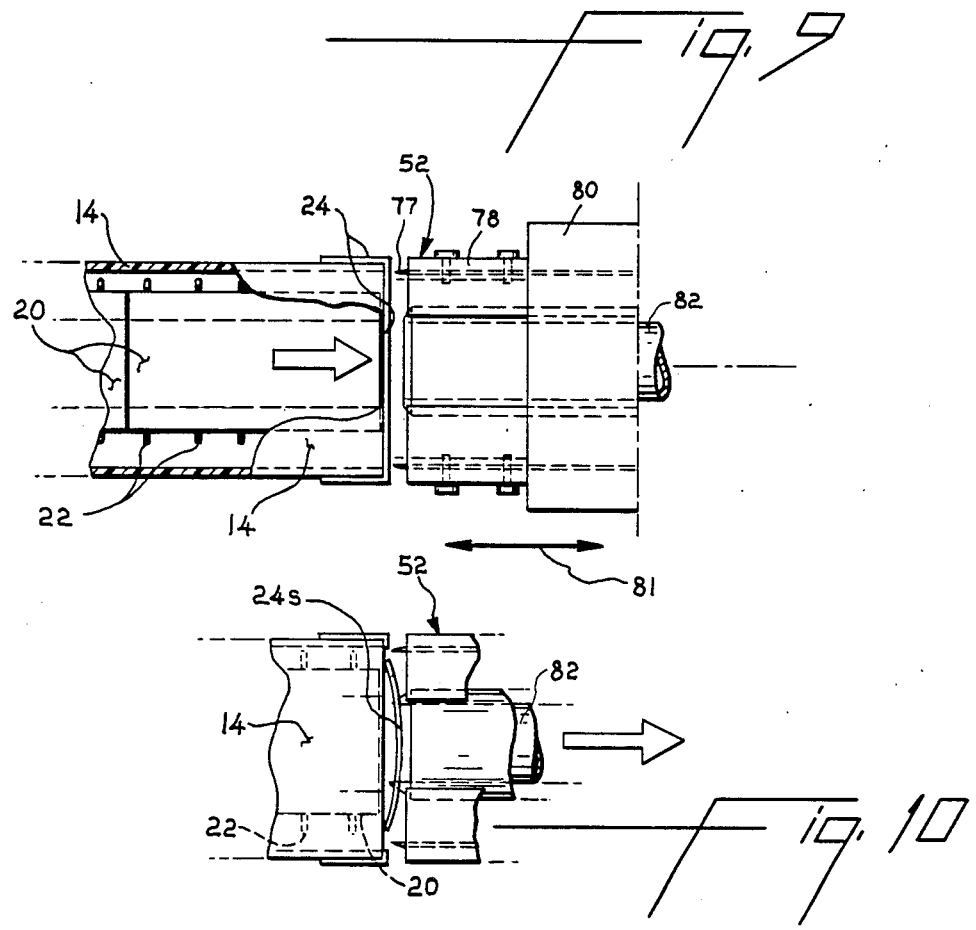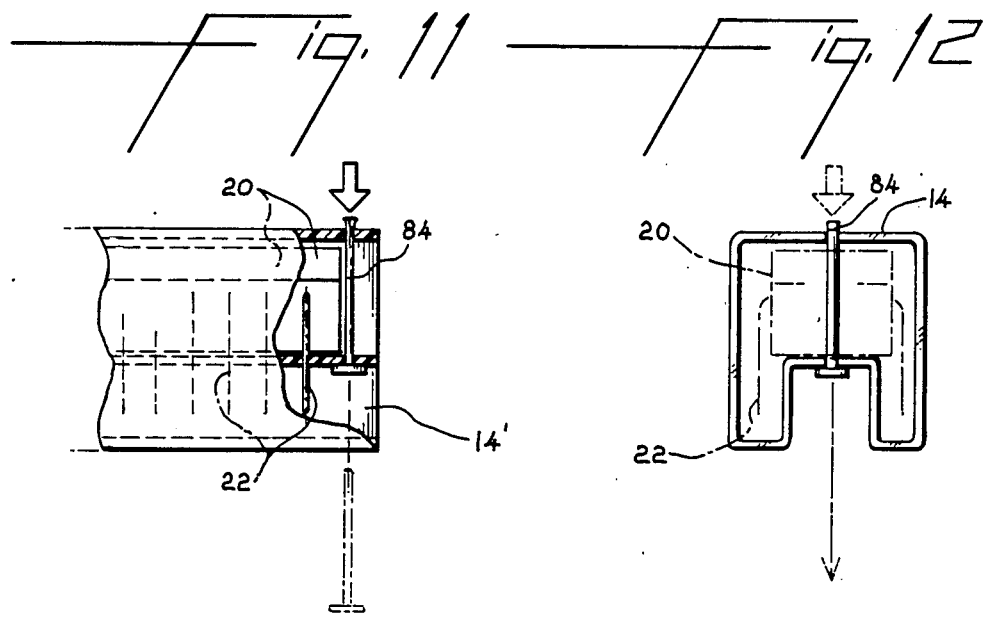

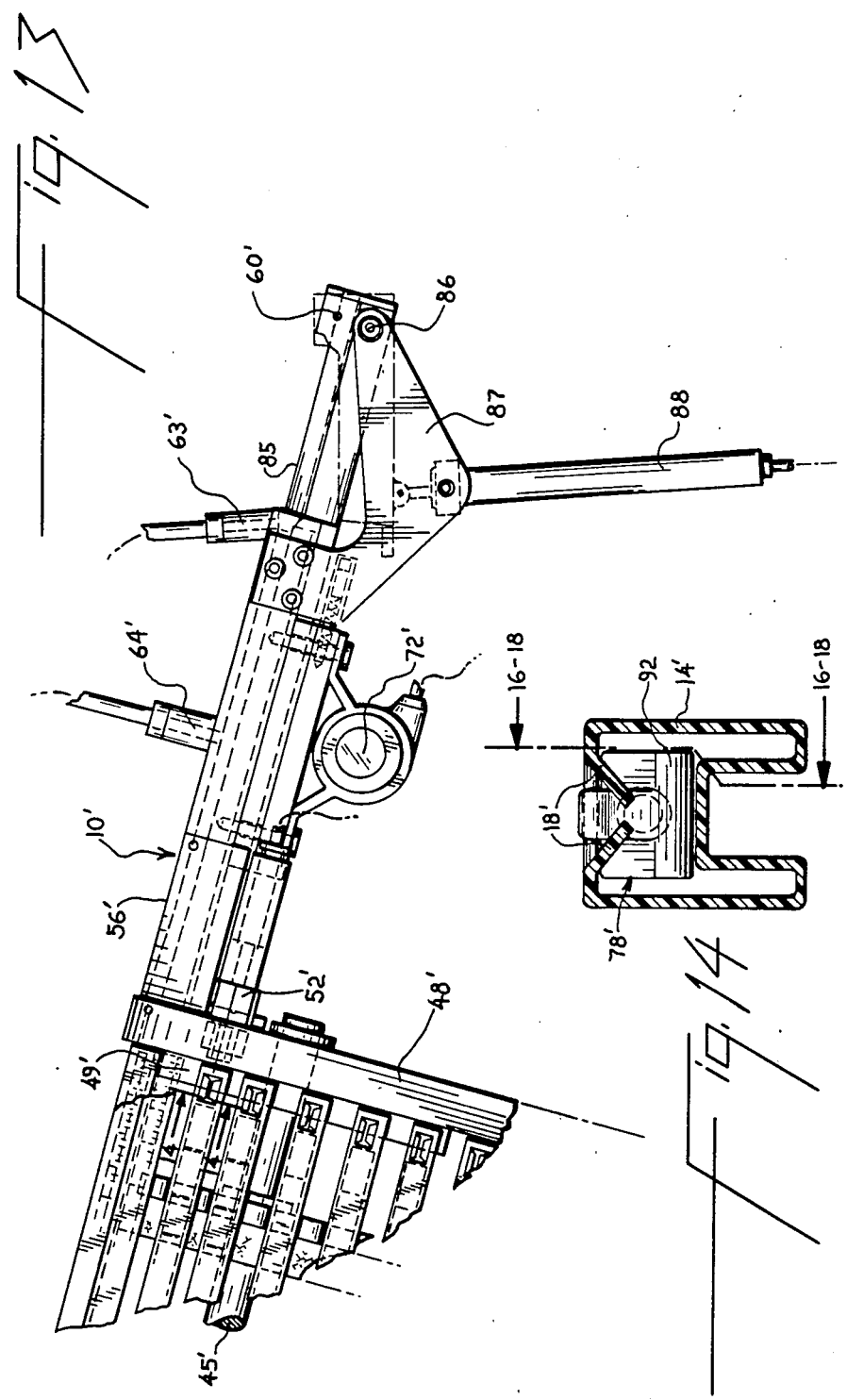

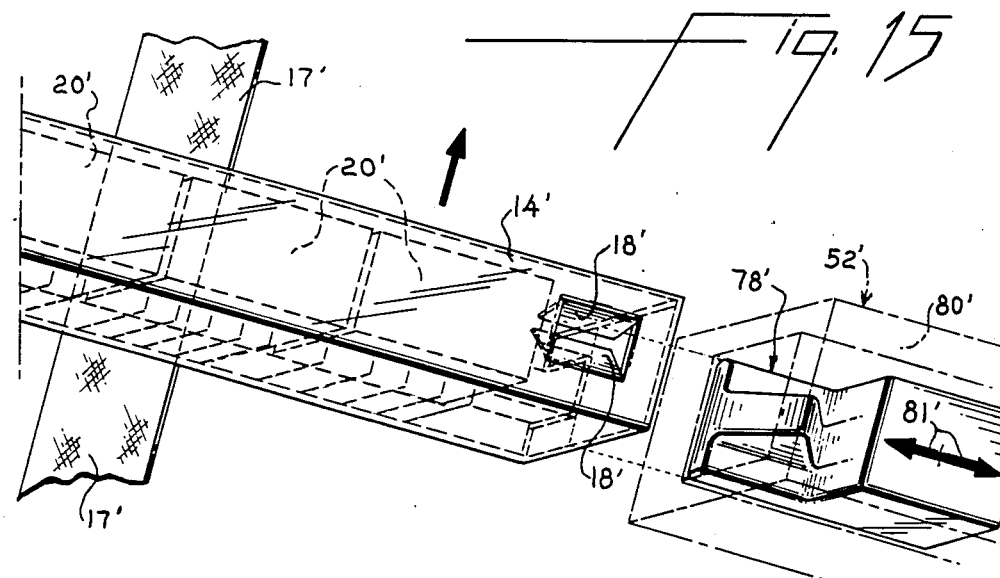
Fig. 15
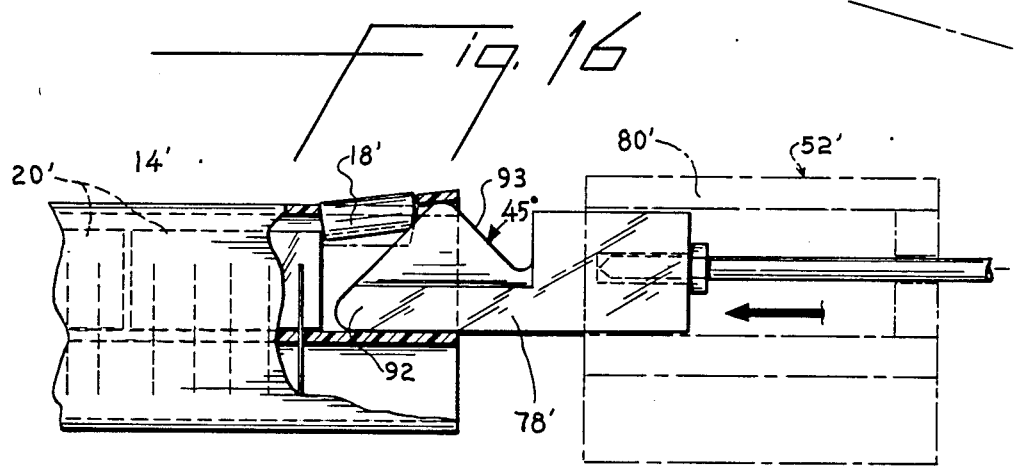
Fig. 16
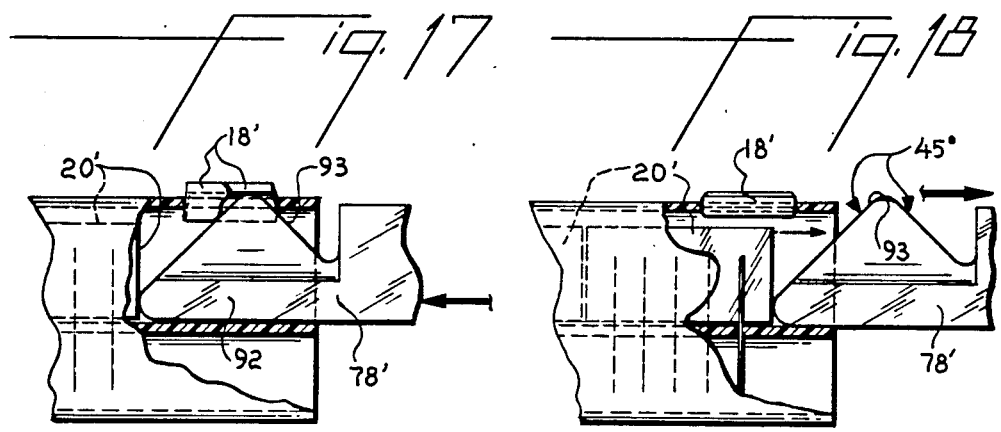
Fig. 17
Fig. 18

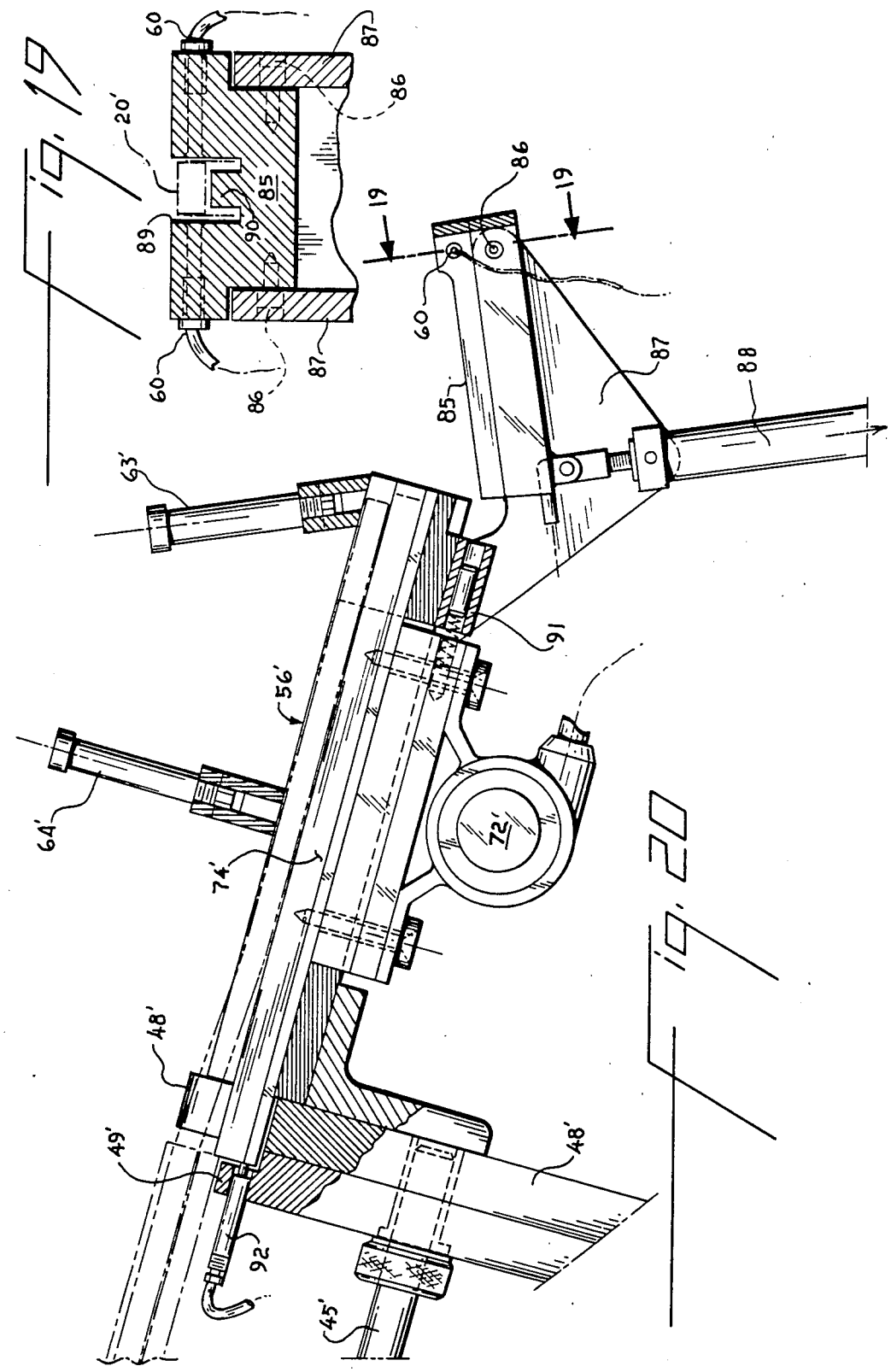

PACKAGE AND APPARATUS FOR DISPENSING ELECTRICAL CONNECTORS

CROSS REFERENCE

This is a continuation-in-part of our copending application Ser. No. 705,181, filled Feb. 25, 1985, now abandoned.

BACKGROUND

This invention relates generally to the installation of electrical connectors on printed circuit boards and, more particularly, to delivery of connectors to a location where they can be picked up by a robot and installed on a printed circuit board.

Semiautomatic systems which dispense different connectors and indicate to an assembler where each is to be placed on a circuit board have been disclosed by Kurek et al. in U.S. Pat. No. 4,222,166 and by Knuth et al. in U.S. Pat. No. 4,250,615. With such systems, the assembler must handle each connector, place it at the correct location and install it. The different connectors are supplied in tubes, each of which must be replaced when empty. Thus, the dispensers disclosed by Kurek et al. and Knuth et al. cannot be used in any fully automated system for dispensing and installing electrical connectors.

SUMMARY

With the apparatus of the present invention, articles such as electrical connectors are dispensed automatically from a specialized package. The package is a belt including at least one elongated tape and a plurality of spaced, article-containing tubes secured to and extending across the tape. Each tube has a closure at each end which holds the articles in the tube. The apparatus includes a stand provided with upper and lower support members. A slide extends downwardly from the lower support member to a perch and there is a stepping device for advancing successive tubes over the support members to the slide. On the lower support member, there is a device for opening the closure at the lower end of a tube approaching the slide. An escapement on the slide releases successive articles to the perch.

DRAWINGS

FIG. 1A is an end view of the package shown in FIG. 1.

FIG. 1B is a sectional view taken on line 1B—1B in FIG. 1.

FIGS. 2A and 2B are end views of the package shown in FIG. 2.

FIG. 3 shows the path followed by connectors being dispensed from one of the tubes in the package of FIG. 2.

FIG. 4 is a side view of an apparatus for dispensing connectors.

FIG. 5 is a fragmentary enlargement of the apparatus shown in FIG. 4.

FIGS. 6–8 are views taken on similarly numbered lines in FIG. 5.

FIGS. 9 and 10 illustrate the cutting device shown in FIG. 6.

FIGS. 11 and 12 illustrate a modified closure for the tubes shown in FIG. 2.

FIG. 13 is a fragmentary side view of a modified apparatus.

FIG. 14 is a sectional view taken on line 14—14 in FIG. 13.

FIGS. 15–18 are fragmentary perspective and side views showing operation of the modified tube-opening device.

FIG. 19 is a sectional view taken on line 19—19 in FIG. 20.

FIG. 20 is an enlarged view of the apparatus shown in FIG. 13, parts having been broken away and shown in section to reveal details of construction.

DESCRIPTION

Figure 1:
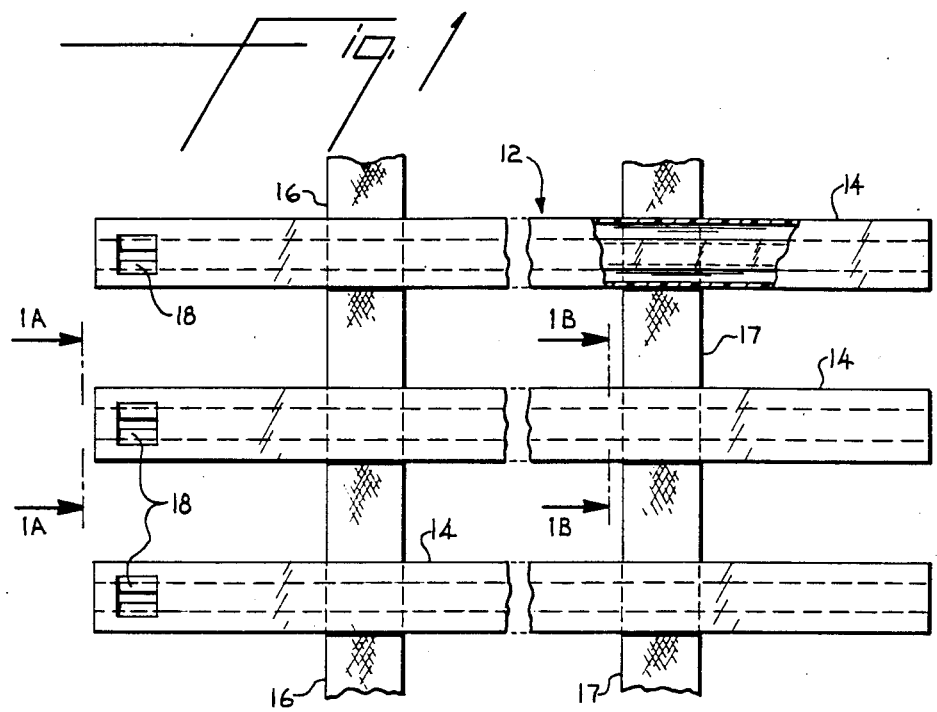
FIG. 1 is an illustration of an empty package for electrical connectors.
Figure 2:
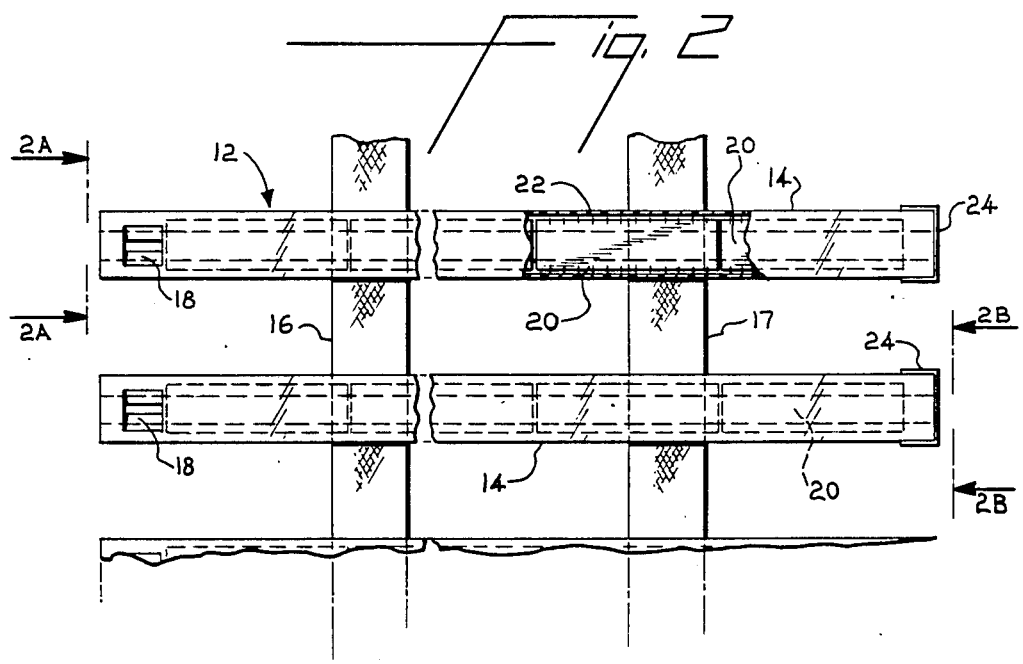
FIG. 2 is a fragmentary illustration of a package containing connectors.

An apparatus 10 for dispensing connectors is shown in FIG. 4 and a package 12 adapted for use with the apparatus 10 is shown in FIGS. 1–3.

The package 12 is an elongated belt having plural parallel plastic tubes 14 arranged transversely of a pair of tapes 16,17. Tapes 16,17 are strips or webs of an industrial fabric. Tubes 14 are equispaced and secured to the tapes with a hot melt plastic adhesive.

Empty tubes 14 are shown in FIGS. 1, 1A and 1B. They are U-shaped in cross section and, at one end, have closures in the form of tabs 18 struck and bent inwardly from the outer wall of each tube. As shown in FIGS. 2, 2A and 2B, the U-shaped configuration adapts the tubes to carry plural articles such as connectors 20 having dual-in-line rows of contacts 22. A typical example is a horizontal card connector which is adapted to receive another connector having mating pins. After each tube is filled with connectors, its other end is closed with a piece 24 of paper tape.

Referring now to FIG. 4, each elongated belt 12 is shipped in a cardboard carton 26 which, when opened, is placed on a shelf 28. Shelf 28 is pivotally mounted at 30 to a stand 32. Above shelf 28, there is platform 34 which is pivotally mounted on stand 32 at 36. Shelf 28 and platform 34 are pivoted with respect to stand 32 by a handwheel 38 and a tie-rod 40. Movement of carton 26 on the tilted shelf 28 is prevented by a flange 42.

An end of belt 12 is trained over a spaced pair of sprocket wheels 43,44 which are fixed on a shaft 45. Shaft 45 is mounted in bearings on upper and lower support members 46,48 and is coupled to a stepping motor 50 provided with a control box 51. Motor 50 and the sprocket wheels 43,44 will be referred to herein as a stepping device.

As shown in FIGS. 4–6, support members 46,48 are recessed on their inner sides to provide arcuate guide surfaces 47,49 for the ends of tubes 14. As each tube 14 approaches the tops of support members 46,48, a slug of the paper tape 24 is removed by a cutting device 52. At the top of member 48, there is a slot 54 (FIG. 6) through which connectors 20 pass to a slide 56. Presence of the first connector 20 on a perch defined by a stop plate 58 is detected by a first sensor 60. There is a second sensor 61 on slide 56 and a third sensor 62 on support member 48. The second and third connectors 20 are held in place by the actuating rods of air cylinders 63,64 until the first connector has been picked up by a robot. Cylinder 63 has a fixed mount 65 and cylinder 64 has a movable mount 66. Cylinders 63,64 will be referred to herein as an escapement.

Movability of the mount 66 is shown in FIGS. 4, 5 and 7 where it is seen that cylinder 64 is threaded into an aperture through a lateral extension from a T-shaped plate 67. The end of the rod in cylinder 64 carries a cap 64c. There is also a cap on the end of the rod in cylinder 63. Plate 67 is attached to a dovetail or tenon 68 and the tenon is clamped in a mortise 69 by a set screw 70. These features facilitate adjustments of the space between cylinders 63,64 to articles of different lengths.

Referring now to FIGS. 4-8, there is a vibrator 72 mounted on the bottom of slide 56. Vibrator 72 is attached to a fin 73 which depends from an elongated, T-shaped element 74. Fin 73 projects through a slot 75 in the body of slide 56. A second slot 75 is shown in FIGS. 5 and 8. As shown in FIG. 7, the base of the T-shaped element 74 fits in channels at the bottom of a groove 76. A narrowed end of T-shaped element 74 extends through slot 54 (FIG. 6) and contacts the tube 14 then in the dispensing position. Movement of connectors from that tube and along the top of element 74 is assisted by the force of gravity and by the jiggling motion imparted by vibrator 72. Vibrator 72, cutting device 52 and the photodetectors are wired through a junction box 71 (FIG. 4).

As shown in FIGS. 6-8, sensors 60,61,62 have two elements. One element is a light source, the other a photodetector. These elements have been designated 60s, 60p, 61p and 62p.

Specific features of the cutting device 52 have been illustrated in FIGS. 9 and 10. There are two blades 77 on a plunger 78 which is slidable in a housing 80 and is provided with an actuator, indicated by an arrow 81, for moving the blades through a paper tape 24. FIG. 10 shows how a cut slug 24s is removed by the application of a vacuum to a tube 82.

After a carton 26 has been placed on shelf 28, the operator must remove the tapes 24 from three of the tubes 14 as the end of the belt is moved up the arcuate guide surfaces 47,49 and fitted over sprocket wheels 43,44. At this time, the rod in cylinder 64 is retracted and the rod in cylinder 63 is extended. Connectors from the first tube 14 slide into engagement with the rod on cylinder 63. Then, the absence of a connector at the location of photodetector 60 is sensed, the positions of the rods in cylinders 63,64 are reversed and vibrator 72 is activated. When a connector reaches stop plate 58, photodetector 60 senses its presence there and the positions of the rods in cylinders 63,64 are again reversed. The vibrator 72 remains active until another connector reaches the extended rod of cylinder 63. The connector on the perch at the stop plate is then ready to be picked up by a robot which installs it on a circuit board or other component. Removal of the bottom connector on slide 56 is sensed by detector 60 and the cylinders 63,64 are again sequenced to release another connector. As noted above, movement of the connectors, when released, is assisted by the jiggling motion imparted by vibrator 72.

When the absence of a connector is sensed by both of the photodetectors 61,62, the sensed signal activates the stepping motor 50 and another tube is indexed to the top position, with its opened end in line with slot 54 in support member 48. In the event of a jam in tube 14, i.e., a connector bridging the tube and the lower support member 48, the presence of a connector is sensed by photodetector 62. The sensed signal activates an alarm and inactivates the apparatus. As each tube reaches the location of cutting device 52, a slug 24s is cut from paper 24 to open the tube but the connectors 20 cannot escape until the tube is indexed to the location of slot 54.

The spent length of belt 12 falls into another carton placed behind the carton 26.

In this manner, connectors are dispensed to a perch where they can be picked up by a robot and installed in successive circuit boards as the boards are advanced through a fully automated system. A programmed controller is used to receive the sensed signals and to initiate the activities mentioned herein.

Instead of paper tapes 24, the ends of the tubes to be opened can be closed by polymeric pins of the type shown at 84 in FIGS. 11 and 12. In a preferred embodiment, the ends to be opened are closed by tabs 18', as shown in FIG. 14-18.

A preferred embodiment of the apparatus is shown in FIGS. 13, 19, 20 and has been designated by the numeral 10'. Details of the tube-opening device are shown in and will be described in connection with FIGS. 14-18. Vibrator 72' is a VIBROLATOR ® ball type vibrator. Model No. CV-10 (Martin Engineering Co., Neponset, Ill.). An end section 85 of slide 56' is pivotally mounted at 86 between a pair of plates 87 and the plates 87 are fixedly attached to the sides of slide 56'. End section 85 is moved between a position of alignment with slide 56' and a horizontal position by a piston-cylinder assembly 88.

As shown in FIG. 19, the pivoted end section 85 has a U-shaped groove 89 defined by a central rail 90 which receives connectors 20 from slide 56'.

Referring now to FIG. 20, it will be seen that vibrator 72' is fastened to the T-shaped slide element 74' and that this assembly is normally biased by a spring 91 to a position where the upper end of slide 74' engages a tube 14'. When a tube has been emptied, the upper end of slide 74' is moved away from the path of the tubes over the guiding surface on support member 48' by an air cylinder 92 for the purpose of avoiding a jam between slide 74' and the next tube 14'.

The operation of the preferred embodiment is the same as for the apparatus shown in FIGS. 4 and 5 except for the pivoted end section 85, a different tube-opening device 52' and the provision of spring 91, air cylinder 92 and a sturdier vibrator 72'.

When the presence of a connector 20' is sensed by detector 60', end section 85 is moved to its horizontal position to facilitate pick-up by a robot. As soon as the connector at the end of section 85 has been picked up and before release of the next connector by the air cylinder 63', section 85 is returned to its position of alignment with slide 56'.

Referring now to FIGS. 14-18, the end of each tube 14' to be opened by device 52' is closed by tabs 18' struck and bent inwardly from the outer wall. Device 52' has a plunger 78' which is slidable in a housing 80' and is provided with an actuator, indicated by an arrow 81', for moving the plunger into the end of tube 14'.

Plunger 78' has a tip 92 which is T-shaped in cross section (FIG. 14). Tip 92 has a base which is rounded across its bottom and a tapered leg 93 which is rounded at its top. Leg 93 has its leading and trailing edges disposed at angles of about 45°. The base fits easily into a tube 14' where its leading edge engages the outer wall (FIG. 16) of the tube and the tabs 18' (FIG. 17) which are bent outwardly from the wall of the tube. When tip 78' is withdrawn, tabs 18' are held in an interference fit (FIG. 18) and tube 14' is open for the discharge of connectors 20' when it reaches the slot at the top of lower support member 48' (FIG. 13). Because of the angularly disposed leading and trailing edges and the rounded top of leg 93, the upper wall of the tube is deformed but does not tear as tip 78' is inserted and withdrawn.

What is claimed as new and desired to be secured by Letters Patent is:

1. An apparatus for dispensing articles from elongated tubes secured to and arranged in spaced parallelism across a flexible tape, each tube having a closure at each end for holding articles therein, said apparatus comprising a stand provided with upper and lower support members for the ends of the tubes, a slide extending downwardly from the lower support member to a perch, a stepping device for advancing successive tubes along said support members to the location of said slide, and means on the lower support member for opening the closure at the lower end of each tube in its approach to the slide, said means having an opening device extending through said lower support member at the location of the tube to be opened.

2. The apparatus of claim 1 wherein said slide has an upper surface provided with an elongated groove and wherein is provided an elongated element in said groove and means associated with said element for vibrating it, said element having an upper surface adapted to receive articles from a tube and to guide the articles as they move toward said perch.

3. The apparatus of claim 2 wherein is provided a spring at the lower end of the elongated element for biasing it into engagement with a tube and a mechanism at the upper end of said element for moving it away from the path of the tubes over said lower support member.

4. The apparatus of claim 1 wherein said support members have recessed, arcuate guide surfaces for the ends of said tubes and said lower support member has a slot therethrough for the passage of articles to said slide, there being an escapement on the slide for releasing successive articles to said perch.

5. The apparatus of claim 4 wherein said closure at the lower end of each tube comprises tabs struck and bent inwardly from the tube and wherein said opening device is a plunger having a tapered leading edge adapted to bend the tabs outwardly into an interference fit.

6. The apparatus of claim 4 wherein said slide has an upper surface provided with an elongated groove in which the articles move toward said perch and wherein said escapement is comprised of a spaced pair of air cylinders, each cylinder having a rod adapted to extend into said groove.

7. The apparatus of claim 1 wherein said slide has an end section mounted for swinging movement between a position of alignment with the slide and a horizontal position and wherein is provided means for swinging the end section between said positions, said perch being at the lower end of said end section.

8. An apparatus for dispensing articles from tubes secured to and arranged in spaced parallelism across a tape, each tube having a closure at each end for holding articles therein, said apparatus comprising a stand provided with upper and lower support members for the ends of the tubes, a slide extending downwardly from the lower support member to a perch, said slide having an upper surface provided with an elongated groove, a stepping device for advancing successive tubes along said support members to the location of said slide, and means on the lower support member for opening the closure at the lower end of each tube in its approach to the slide, an elongated element in said groove and means associated with said element for vibrating it, said element having an upper surface adapted for engagement with the articles as they move toward said perch.

9. The apparatus of claim 8 wherein is provided a spring at the lower end of the elongated element for biasing it into engagement with a tube and a mechanism at the upper end of said element for moving it away from the path of the tubes over said lower support member.

10. The apparatus of claim 8 wherein said support members have recessed arcuate guide surfaces for the ends of said tubes and said lower support member has a slot therethrough for the passage of articles to said slide, there being an escapement on the slide for releasing successive articles to said perch.

11. The apparatus of claim 10 wherein said means for opening the closure on a tube has an opening device extending through said lower support member at the location of the tube to be opened.

12. The apparatus of claim 11 wherein said closure at the lower end of each tube comprises tabs struck and bent inwardly from the tube and wherein said opening device is a plunger having a tapered leading edge adapted to bend the tabs outwardly into an interference fit.

13. The apparatus of claim 12 wherein said slide has an end section mounted for swing movement between a position of alignment with the slide and a horizontal position and wherein is provided means for swinging the end section between said positions, said perch being at the lower end of said end section.

* * * * *